United States Patent [19]

Grundy et al.

[11] Patent Number: 5,022,905
[45] Date of Patent: Jun. 11, 1991

[54] METHOD AND APPARATUS FOR COATING GLASS

[75] Inventors: Barry T. Grundy, Wigan; Edward Hargreaves; Peter J. Whitfield, both of Merseyside, all of England

[73] Assignee: Pilkington PLC, St. Helens, United Kingdom

[21] Appl. No.: 420,513

[22] Filed: Oct. 12, 1989

[30] Foreign Application Priority Data

Oct. 14, 1988 [GB] United Kingdom ............... 8824102

[51] Int. Cl.$^5$ ............................................. C03C 17/34
[52] U.S. Cl. ................... 65/60.51; 65/60.52; 65/60.53; 65/60.8; 65/254; 118/326; 118/718; 118/719; 427/255.2
[58] Field of Search ............... 118/718, 326, 719; 65/60.1, 60.5, 60.51, 60.52, 60.53, 60.8, 254; 427/255.2

[56] References Cited

U.S. PATENT DOCUMENTS

| | | | |
|---|---|---|---|
| 4,293,326 | 10/1981 | Terneu et al. | |
| 4,325,987 | 4/1982 | Kalbskopf et al. | |
| 4,728,353 | 3/1988 | Thomas et al. | 118/326 X |
| 4,793,282 | 12/1988 | Greenberg et al. | 118/718 X |
| 4,878,934 | 11/1989 | Thomas et al. | 65/60.52 |
| 4,917,717 | 4/1990 | Thomas et al. | 65/60.1 |

FOREIGN PATENT DOCUMENTS

| | | |
|---|---|---|
| 2456077 | 12/1980 | France . |
| 2518429 | 6/1983 | France . |
| 904513 | 6/1974 | U.S.S.R. . |
| 1307216 | 2/1973 | United Kingdom . |
| 1307361 | 2/1973 | United Kingdom . |
| 1507465 | 4/1978 | United Kingdom . |
| 1507996 | 4/1978 | United Kingdom . |
| 1516032 | 6/1978 | United Kingdom . |
| 1524326 | 9/1978 | United Kingdom . |
| 2026454 | 7/1982 | United Kingdom . |
| 2033374 | 11/1982 | United Kingdom . |
| 2113120 | 11/1985 | United Kingdom . |
| 2184748 | 7/1987 | United Kingdom . |
| 2185249 | 7/1987 | United Kingdom . |
| 2185250 | 7/1987 | United Kingdom . |
| 2187184 | 9/1987 | United Kingdom . |

Primary Examiner—Robert L. Lindsay
Attorney, Agent, or Firm—Burns, Doane, Swecker & Mathis

[57] ABSTRACT

An apparatus for depositing onto the surface of a moving ribbon of hot glass a coating formed from the reaction of at least two gaseous reactants. The apparatus includes an open-faced coating chamber in which the gaseous reactants are caused to flow in contact with the glass surface to be coated in a direction substantially parallel to the direction of movement of the glass so as to form the desired coating on the glass surface. The coating chamber opens downwardly onto, and extends across the width of, the glass surface to be coated, and has a first inlet means for providing a flow of a first gaseous reactant over the glass surface through the chamber over the width thereof, and a second inlet means constituted by an inlet channel which extends across the ceiling of the chamber over the width of the chamber for introducing a second gaseous reactant to the flow of the first gaseous reactant in the coating chamber. The ceiling of the coating chamber has a stepped configuration at the juncture of the said inlet channel and the coating chamber, so that the ceiling of the coating chamber on the upstream side of the inlet channel is at a higher level than the ceiling of the coating chamber on the downstream side of the said inlet channel. A first gas distributor conveys the first gaseous reactant from a gas supply duct to said first inlet means, and a second gas distributor conveys the second gaseous reactant from a second gas supply duct to said second inlet means. Exhaust means are located downstream of the first and second inlet means leading from the coating chamber for removal of spent gases from the coating chamber.

12 Claims, 4 Drawing Sheets

METHOD AND APPARATUS FOR COATING GLASS

BACKGROUND TO THE INVENTION

The present invention relates to apparatus for coating glass, and more particularly to apparatus for applying a coating onto the surface of a moving ribbon of hot glass from gaseous reactants which react together to form a coating on the glass surface.

DESCRIPTION OF THE PRIOR ART

It is well known that coatings with desirable properties for architectural use can be produced using gaseous reactants which decompose on the hot glass surface. Thus silicon coatings, useful as solar control coatings, have been produced by pyrolysing a silane-containing gas on a hot glass surface, and there have been many proposals to produce other solar control and low emissivity (high infra red reflection) coatings from other appropriate gaseous reactants. Unfortunately, it has proved difficult in commercial practice to achieve sufficiently uniform coatings of the required thickness.

A typical method and apparatus for coating glass with such coatings is described in our UK patent specification 1 507 996, in which a uniform coating is applied from a reactant gas by causing the gas to flow parallel to the glass surface under laminar flow conditions. In this specification, no specific provisions are made for the use of mixtures of reactants which are liable to react together before reaching the glass surface.

UK patent specification 1 516 032 describes a process of coating glass using a fluid medium, containing one or more coating reactants which may be in liquid or gaseous form, which is directed on to the hot glass as a stream or streams at least one of which has a velocity component in the direction of movement of the ribbon and is inclined to the face of the ribbon at an angle (or mean angle) of not more than 60°. Use of the invention is said to give a coating characterised by a glass-contacting stratum of homogenous structure featuring a regular arrangement of crystals. Where two or more components are required to react together, these may be supplied as separate streams through adjacent nozzles each arranged to provide a stream of reactant at an acute angle to the glass surface so that the reactants come into contact with one another in the vicinity of the glass; or a single nozzle can be used to supply a first stream of reactant while a stream of air, serving as a second reactant, is induced to flow to the reaction zone by the momentum and inclination of the first stream. An exhaust duct may be provided downstream of the coating zone to draw gas away from the coating zone, and a hood may be provided to define, with the glass surface, a flow passage over the glass away from the area of impingement of the fluid stream(s) on the glass.

UK patent specification 1 524 326 describes a process in which a gaseous medium is caused to flow along the substrate to be coated as a substantially turbulence-free layer along a flow passage defined in part by the face of the glass; the flow passage leads to an exhaust ducting via which residual gas is drawn away from the glass. The gaseous reactants are introduced into the flow passage through entry channels leading into the upstream end of the flow passage, the entry channels being positioned to introduce the gaseous reactants together at an acute angle to the glass.

UK patent specification 2 026 454B is particularly concerned with a process for forming a tin oxide coating on a hot glass surface, using a gaseous medium containing tin tetrachloride and water vapour. In a particularly preferred embodiment, a stream of nitrogen carrier gas containing tin tetrachloride vapour is caused to flow along the glass face being coated and a stream of air containing water vapour is delivered into that stream at a position where it is in flow along the said face. A doping agent, such as hydrogen fluoride, can be fed to the substrate face separately, or mixed with the moist air. The streams of gas are preferably fed to the glass surface by introducing the gas streams into a coating gallery or chamber formed by a shallow flow passage through which the gas streams flow as a substantially turbulence-free layer to an exhaust ducting by which residual gas is drawn away from the glass. The gas streams are introduced into the coating chamber through feed conduits leading into the roof of the coating gallery or chamber, which feed conduits are inclined downwardly and forwardly in the direction of travel of the glass ribbon at an acute angle of 45° to the horizontal.

A further process for producing a coating of tin oxide on a hot glass substrate is described in UK Patent Specification No. 2033374B. In this patent, apparatus similar to the apparatus described in UK Patent Specification No. 2026454B mentioned above is used, but the apparatus includes an additional coating chamber, upstream of the first coating chamber, for the purpose of depositing a metal oxide undercoating on the glass substrate before subsequently depositing a tin oxide coating.

In a further method, described in UK patent application GB 2 184 748A, a coating precursor and an oxidising gas are introduced into a mixing zone well above the glass at the upstream end of a coating chamber. Heat is supplied to the mixing zone and the coating precursor and oxidising gas are thoroughly mixed in the mixing zone while exposed to the substrate but at a height such that coating formation commences from a substantially homogeneous vapour mixture. The mixture is then caused to flow continuously through the coating chamber in contact with the upper face of the glass. It is said to be advantageous for the roof structure to reduce in height in the downstream direction, throttling the flow of vapour along the coating chamber. In some preferred embodiments, the roof structure descends as a curve leading into a downstream roof portion above the glass. This is found to promote a smooth general downstream flow of precursor laden vapour within the coating chamber which is said to be beneficial for the uniformity of the coating formed. Advantageously, the coating chamber has a length of at least 5 meters; the use of such a long coating chamber is said to be of particular benefit in increasing the coating yield when forming relatively thick coatings on a rapidly moving substrate such as a ribbon of freshly formed float glass.

When attempting to form a coating on a glass surface from gaseous reactants which react together and using an apparatus of the type in which each of the reactants is introduced into a coating chamber from separate inclined channels, such as the apparatus shown diagrammatically in UK Patent Specification No. 2026454 mentioned above, the applicants found that during operation of the coating process, an undesirable deposit of coating material was found to build up at the lower end of the channel through which the second reactant gas was introduced into the coating chamber. The deposit of material was found to be most prevalent on the upstream side wall of the entry channel. The build-up of the deposit occurred relatively rapidly and very soon interfered with the quality of the coating which was formed on the surface of the glass ribbon. The coating on the glass ribbon rapidly deteriorated and became non-uniform as manifest by stripes which could be seen on the coating deposited on the surface of the glass.

If further deterioration of the coating was to be avoided, the coating process would have to be interrupted, the coating apparatus lifted away from the glass ribbon, and the deposit of unwanted coating material removed from the coating apparatus. This cleaning operation would be time-consuming and wasteful.

There is clearly a need for an apparatus in which problems of unwanted deposition of coating material are minimal, and which allows for longer periods of continuous operation of the coating process.

SUMMARY OF THE INVENTION

The present invention aims to provide an apparatus in which such objectives are met.

According to the present invention there is provided apparatus for depositing onto the surface of a moving ribbon of hot glass a coating formed from the reaction of at least two gaseous reactants, which apparatus includes an open-faced coating chamber in which the gaseous reactants are caused to flow in contact with the glass surface to be coated in a direction substantially parallel to the direction of movement of the glass so as to form the desired coating on the glass surface, the coating chamber opening downwardly onto, and extending across the width of, the glass surface to be coated, the coating chamber having a first inlet means for providing a flow of a first gaseous reactant over the glass surface through the chamber over the width thereof, and a second inlet means constituted by an inlet channel which extends across the ceiling of the chamber over the width of the chamber for introducing a second gaseous reactant to the flow of the first gaseous reactant in the coating chamber;

the ceiling of the coating chamber having a stepped configuration at the juncture of the said inlet channel and the coating chamber, so that the ceiling of the coating chamber on the upstream side (with reference to flow of the first reactant gas) of the inlet channel is at a higher level than the ceiling of the coating chamber on the downstream side (with reference to flow of the first reactant gas) of the said inlet channel, the line described by a longitudinal cross-section taken through the ceiling having a stepped configuration;

a first gas distributor for conveying the first gaseous reactant from a gas supply duct to said first inlet means, and a second gas distributor for conveying the second gaseous reactant from a second gas supply duct to said second inlet means;

and exhaust means located downstream (with reference to flow of the reactant gases) of the first and second inlet means leading from the coating chamber for removal of spent gases from the coating chamber.

According to a further aspect of the present invention there is provided a method of depositing a coating formed from the reaction of at least two gaseous reactants onto the surface of a moving ribbon of hot glass which comprises providing a flow of a first gaseous reactant in a direction substantially parallel to the direction of movement of the glass in a coating chamber over the glass and introducing a second gaseous reactant to the flow of the first gaseous reactant through an inlet means constituted by an inlet channel which extends across the ceiling of the chamber and causing said first and second gaseous reactants to flow through said coating chamber in contact with the glass surface in a direction substantially parallel to the direction of movement of the glass to form the desired coating on the glass, the ceiling of the coating chamber having a stepped configuration at the juncture of the said inlet channel and the coating chamber, so that the ceiling of the coating chamber on the upstream side (with reference to flow of the first reactant gas) of the inlet channel is at a higher level than the ceiling of the coating chamber on the downstream side (with reference to flow of the first reactant gas) of the said inlet channel, the line described by a longitudinal cross-section taken through the ceiling having a stepped configuration.

In preferred embodiments of the present invention, the ceiling of the coating chamber on the upstream side of the said inlet channel is usually at least 5 mm higher than the ceiling of the coating chamber on the downstream side of the said inlet channel, and usually not more than 75 mm higher than the ceiling of the coating chamber on the downstream side of the said inlet channel. We have found it convenient to operate with a step of not more than 15 mm, and in one embodiment the ceiling on the upstream side of the said inlet channel is 10 mm higher than the ceiling on the downstream side of the said inlet channel.

In a further preferred embodiment, the inlet channel is disposed substantially at right angles to the flow path of the reactant gases through the coating chamber.

In a particularly preferred arrangement, the base of the downstream side wall of the inlet channel is formed as a convex curved surface at the juncture of the said side wall and the ceiling of the coating chamber.

We have found that by using an arrangement of this type the amount of undesired coating material deposited on the walls of the second inlet channel is significantly reduced. Consequently, the coating apparatus of the present invention can be used for longer periods of time than known coating apparatus without the coating process having to be interrupted for the apparatus to be cleaned and unwanted deposits to be removed from the apparatus.

The first and second gaseous reactants are supplied to the apparatus from respective gas supply ducts and are distributed across the face of the glass surface to be coated by passing the gas streams through respective first and second gas distributors which may be defined between inverted fan-shaped front and rear walls which diverge downwardly from a central inlet to terminate in a slot extending across the width of the glass surface to be coated. In a preferred embodiment, the inverted fan-shaped front and rear walls taper downwardly towards each other to terminate in the said slot.

The apparatus preferably further includes a gas flow restrictor interposed between the first gas distributor and the first inlet means thereby to provide uniform distribution of the first gaseous reactant across the width of the glass surface to be coated. Similar uniform distribution of the second gaseous reactant may also be achieved by providing a second gas flow restrictor between the second gas distributor and the second inlet means, said second gas flow restrictor generally being of the same construction as the first gas flow restrictor.

Typically, such a gas restrictor comprises a chamber which is adapted to receive a supply of reactant gas and is adapted to output a flow of the reactant gas over the flat glass being coated, and a series of at least two restrictions, each restriction comprising a plate member extending across the chamber and having a plurality of apertures therethrough.

In the following description, as in the accompanying claims, the terms "upstream" and "downstream" are used with reference to the direction of flow of reactant gases through the coating chamber. Preferably, as in the specific embodiment to be described by way of example, this is co-current to the direction of glass movement, but this is not necessarily the case and use of the invention may also be advantageous when the direction of flow of reactant gas is counter-current to the direction of glass movement.

BRIEF DESCRIPTION OF THE DRAWINGS

The present invention will now be described in more detail, by way of example only, with reference to the accompanying drawings, in which.

In the drawings, like reference numerals refer to like parts.

DETAILED DESCRIPTION OF THE INVENTION

Figure 1:
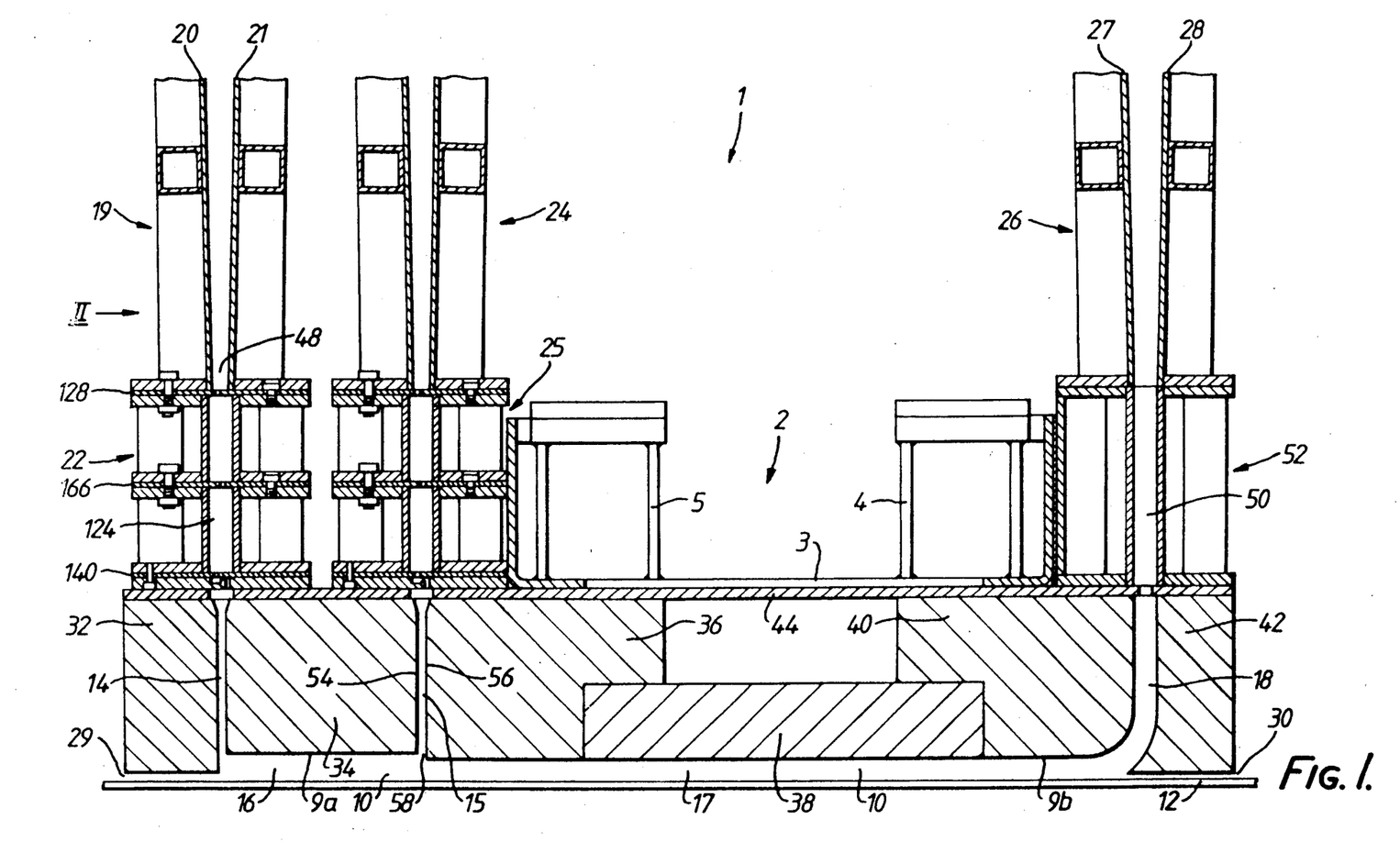
FIG. 1 is a cross-sectional side view of an apparatus in accordance with the present invention.
Figure 2:
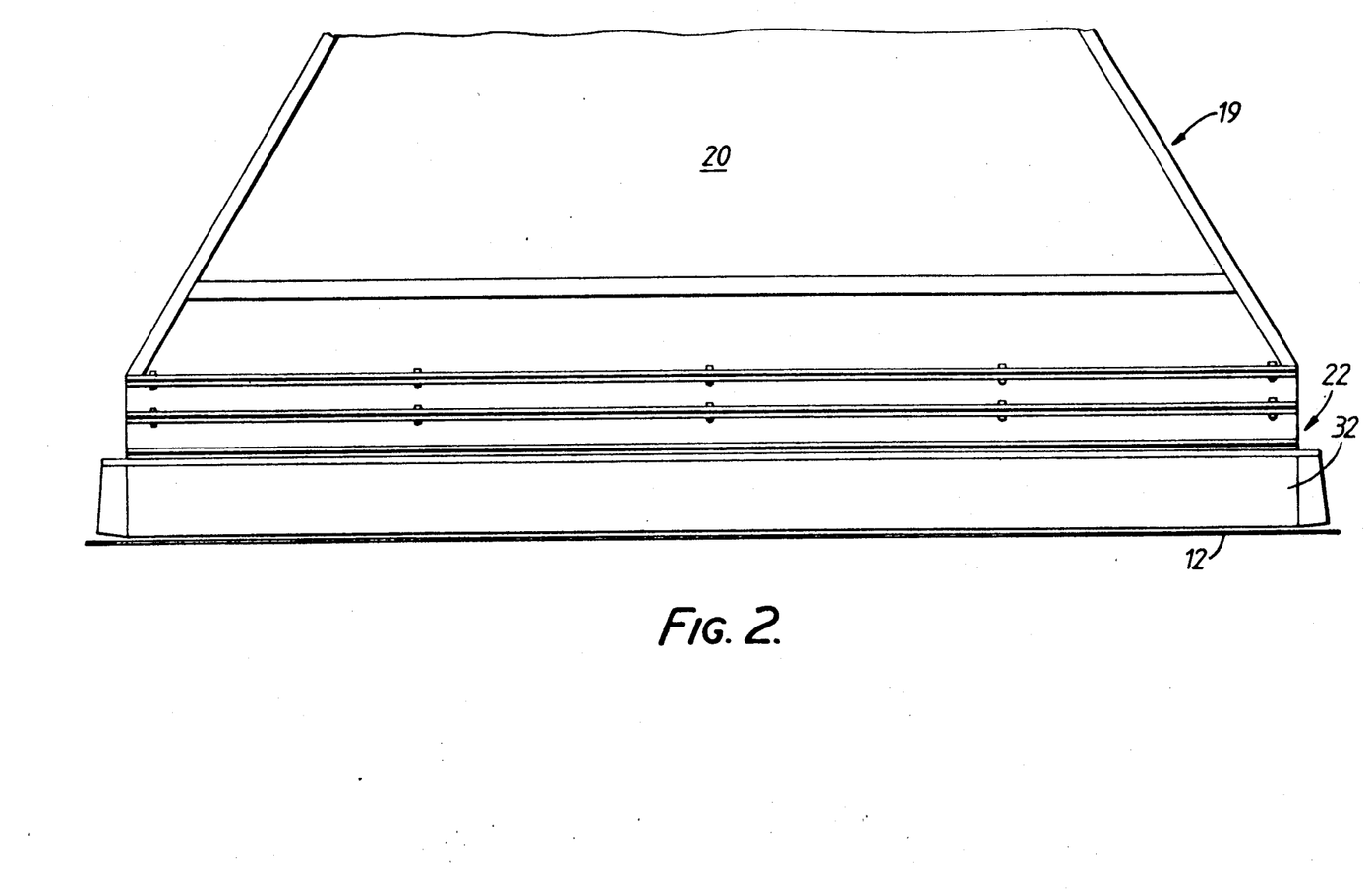
FIG. 2 is an end elevation, taken in the direction of arrow II in FIG. 1, of the apparatus shown in FIG. 1.

Referring particularly to FIGS. 1 and 2, a coating apparatus, generally designated 1, is suspended over a ribbon of glass 12 which is advanced over rollers (not shown) from left to right.

The coating apparatus is suspended from a carriage 2 comprising a horizontal plate 3, the upper surface of which has welded thereto a number of forward mounting brackets such as shown at 4 and of rearward mounting brackets such as shown at 5. Typically three forward and three rearward mounting brackets are provided across the width of the coating apparatus; in each case one bracket is mounted centrally and the other two brackets are mounted near the sides of the apparatus. Each of the mounting brackets 4, 5 is suspended from a respective water cooled beam (not shown) which extends across the width of the ribbon of glass to be coated.

The lower part of the apparatus comprises a number of shaped carbon blocks 32, 34, 36, 38, 40 and 42 which extend transversely for a length corresponding to the width of the glass surface to be coated. The carbon blocks define a coating chamber 10 having a ceiling 9a, 9b of stepped configuration, with the ceiling 9a of the coating chamber 10 upstream of the second inlet channel 15 being higher than the ceiling 9b of the coating chamber downstream of the second inlet channel 15. The said carbon blocks also define a first inlet means constituted by a vertical first inlet channel 14 for the introduction into the coating chamber of a first reactant gas, a second inlet means constituted by a vertical second inlet channel 15 for the introduction into the coating chamber of a second reactant gas, a flow path 16 in the coating chamber between the first inlet channel 14 and the second inlet channel 15, an exhaust channel 18 for removal of used gases from the coating chamber, and a flow path 17 in the coating chamber between the second inlet channel 15 and the exhaust channel 18.

Each of the various carbon blocks is suspended below a horizontal plate member 44. The blocks incorporate ducts (not shown) for a heat transfer fluid such as cooling water, and in use of the apparatus, the temperature of carbon blocks is regulated by passing cooling water through these ducts.

The coating chamber 10 has an open face extending across the ribbon of glass 12 to be coated. At the upstream end of the coating chamber, carbon blocks 32 and 34 define the said vertical first inlet channel 14 through which a first gaseous reactant is introduced into the coating chamber. Downstream of the first inlet channel, a second vertical inlet channel 15 is defined between carbon blocks 34 and 36 for introducing a second gaseous reactant into the coating chamber.

At the downstream end of the coating chamber, carbon blocks 40 and 42 define an exhaust channel 18 for the removal of used gases from the coating chamber.

The first reactant gas is fed to the first inlet channel 14 from a gas supply duct (not shown) through a fantail distributor 19 and a gas flow restrictor 22. The fantail distributor is defined between front and back walls 20 and 21 in the shape of inverted fans, with the front and back walls converging towards one another in a downward direction to form at the bottom of the fantail a narrow slot 48 extending across the width of the glass ribbon to be coated.

The first reactant gas issuing from the slot 48 at the base of the fantail 19 is passed through a gas flow restrictor 22 which is mounted below the fantail 19.

Figure 3:
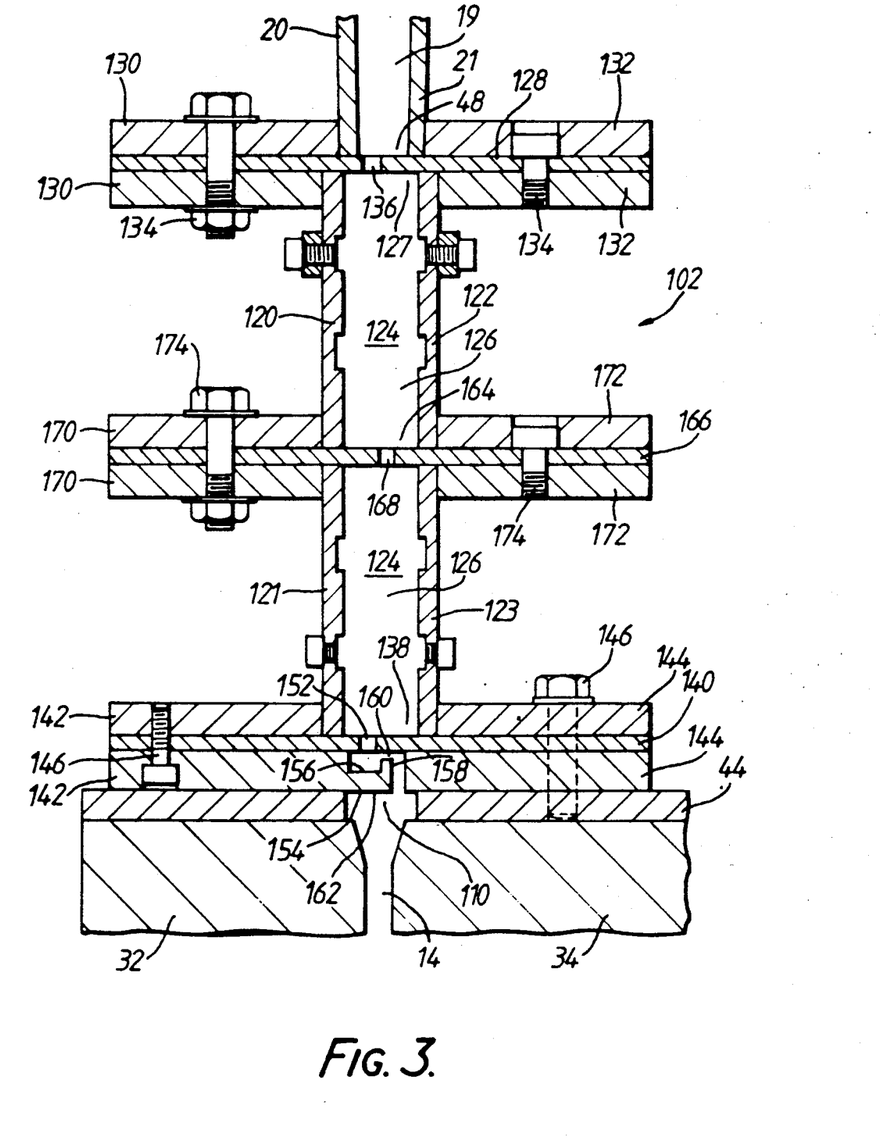
FIG. 3 is a cross-sectional side view showing in greater detail a gas flow restrictor of the type incorporated in the apparatus of FIG. 1.

The gas flow restrictor 22 is illustrated in more detail in FIG. 3 and comprises pairs of opposed elongate walls 120, 122 and 121, 123 which define an elongate chamber 124. The elongate walls 120, 122 and 121, 123 extend transversely across the ribbon of glass being coated, walls 120 and 121 being upstream walls and walls 122 and 123 being downstream walls. Opposed end walls 126 are provided at each end of the elongate chamber 124, each end wall 126 being disposed parallel with the direction of movement of the ribbon of glass.

At the inlet end of the gas flow restrictor 22, is disposed an inlet restriction 127 comprising an inlet elongate plate member 128 which extends across the chamber 124. The inlet plate member 128 is sealingly fixed between opposing pairs of horizontal plates 130, 132, each pair of plates 130, 132 being attached e.g. by welding, to a respective elongate wall 120, 122 and to the fantail distributor 19. The plates of each pair 130, 132 are tightly connected together by threaded connectors 134. Gaskets (not shown) are disposed between each pair of plates 130, 132 and the inlet plate member 128.

A row of apertures 136 is provided along the length of the inlet plate member 128, the apertures 136 connecting the inlet 112 with the remainder of the chamber 124. The apertures 136 are circular holes and preferably have a diameter of from 2 mm to 10 mm. In one particularly preferred embodiment, the holes 136 have a diameter of 4 mm and have centres spaced 20 mm apart. The row of holes 136 is disposed on an upstream side of the elongate chamber 124 i.e. the row of holes 136 is nearer to the upstream wall 120 than to the downstream wall 122 of the chamber 124.

Adjacent the outlet 110 of the gas flow restrictor 22 is disposed an outlet restriction 138. The outlet restriction 138 is of substantially the same construction as the inlet restriction 127 in that it comprises an outlet elongate plate member 140 which is sealingly fixed between two opposing pairs of plates 142, 144, the upper plate of each of said pairs of plates 142, 144 being connected, e.g. by welding, to a respective elongate wall 121, 123. The plates 142, 144 are separated from the outlet plate member 140 by gaskets (not shown). The plates 142, 144 are tightly connected together by threaded connectors 146 which also firmly attach the plates 142, 144, and thereby the gas flow restrictor 22, to plate 44 from which the graphite blocks 32, 34 are suspended. The outlet plate member 140 is provided with a row of holes 152 which preferably have a diameter of from 2 mm to 10 mm and, in one particularly preferred embodiment, have a diameter of 4 mm and centres spaced 10 mm apart. The row of holes 152 is disposed on the upstream side of the elongate chamber 124.

A gas flow deflector 154 is mounted at the outlet 110 of the gas flow restrictor 22 below the outlet plate member 140. The gas flow deflector 154 comprises an elongate L-shaped member 156 which is integral with the lower of said pair of plates 142 and is disposed adjacent the holes 152. The free arm 158 of the L-shaped member 156 extends upwardly towards the outlet plate member 140 to define therebetween a gap 160 through which reactant gas from the holes 152 must pass after having been deflected by the horizontal arms 162 of the L-shaped member 156.

The purpose of the gas flow deflector 154 is to remove certain localised increases in gas flow which may occur. Thus there is a tendency for the gas flow to be more intense in the immediate vicinity of each of the holes 152 in the outlet plate member 140 below the plate member 140. The presence of the gas flow deflector 154 evens out these localised increased intensities of flow. In some instances it may be possible to omit the gas flow deflector 154 from the gas flow restrictor of the invention.

An intermediate restriction 164 is disposed between the inlet and outlet restrictions 127, 138. The intermediate restriction 164 has the same construction as the inlet restriction 127 and comprises an intermediate elongate plate member 166 with a row of holes 168. The intermediate plate member 166 is sealingly fixed between opposing pairs of horizontal plates 170, 172 which are attached, e.g. by welding, to the elongate walls 120, 121 and 122, 123 respectively. Gaskets (not shown) are disposed between the plates 170, 172 and the intermediate plate member 166 and the plates 170, 172 are tightly connected together by threaded connectors 174. The row of holes 168 of the intermediate plate member 166 is, in contrast to the inlet and outlet plate members 128, 140, disposed on a downstream side of the elongate chamber 124, i.e. the row of holes 168 is nearer to the downstream walls 122, 123 than to the upstream walls 120, 121 of the chamber 124. This arrangement results in the row of holes of adjacent elongate plate members being out of line with each other.

The second reactant gas is fed to the second inlet channel 15 from a second gas supply duct (not shown) through a further fantail distributor 24 which is of the same construction as fantail distributor 19 and then through a gas flow restrictor 25 which is of the same construction as gas flow restrictor 22.

Exhaust gases issuing from exhaust channel 18 pass through a channel 50 in a spacer unit 52 and then into an exhaust fantail 26 comprising inverted fan-shaped front and rear walls 27 and 28. The exhaust fantail conveys waste gases, unreacted reactant gases and carrier gases to an exhaust duct (not shown).

The respective heights of carbon blocks 32, 34 and 36 which define the first inlet channel 14 and the second inlet channel 15 are chosen so that the ceiling 9a, 9b, of the coating chamber 10 is provided with a stepped configuration at the juncture of the second inlet channel 15 and the coating chamber, the ceiling 9a of the coating chamber on the upstream side of the said inlet channel 15 being at a higher level than the ceiling 9b of the coating chamber on the downstream side of the second inlet channel 15, and as will be seen from FIG. 1, the line described by a longitudinal cross-section taken through the ceiling is discontinuous and has a stepped configuration. Thus the bottom of the block 36 may typically be chosen to be 10 mm lower than the bottom of block 34. As a result, the base of the upstream wall 54 of the second inlet channel may be 10 mm higher than the base of the downstream wall 56 of the second inlet channel 15 thereby forming an inlet slot 58 having a stepped configuration. Such a stepped inlet slot 58 is found to minimize the amount of solid coating material deposited on the side walls of the second inlet channel 15 in the vicinity of the inlet slot 58. The step is believed to operate by directing the flow of the first gaseous reactant towards the glass surface and avoiding flow of the first gaseous reactant into the mouth of the second inlet channel with consequent risk of local reaction with deposition of coating material on vertical surfaces in the mouth of the inlet channel.

Figure 4:
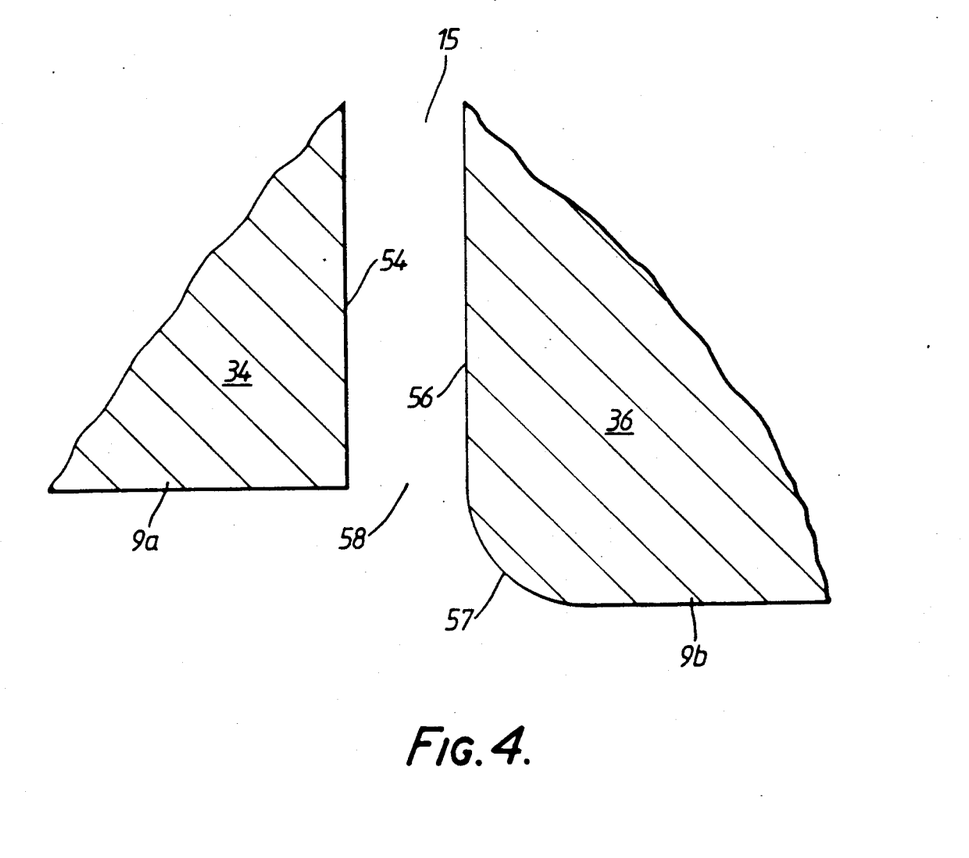
FIG. 4 is a cross-sectional side view, partly cut away, showing a preferred configuration for the lower end of the second inlet means.

In a particularly preferred arrangement, the lower upstream corner of carbon block 36 is formed as a convex curved surface 57, such as illustrated in FIG. 4, typically having a radius of curvature of 10 mm for a stepped inlet slot 58 which is 10 mm in height. The radius of curvature should be sufficiently small to maintain the effect of the step in substantially avoiding troublesome build-up of deposits in the mouth of the second inlet channel.

In use, the coating apparatus of the invention is suspended over a ribbon of glass 12 which is advanced over rollers (not shown) from left to right. The coating apparatus is suspended at a height over the glass ribbon which is such that the carbon block 42 at the downstream end of the apparatus is held at a height of the order of 10 mm above the surface of the ribbon of glass to be coated. A first reactant gas, generally diluted in a carrier gas, is fed to fantail distributor 19 and gas restrictor 22 which provides uniform distribution of the gas across the width of the glass to be coated. The gas emanating from the gas restrictor 22 passes through first inlet channel 14 and into the coating chamber 10 and travels in a first general direction parallel to the glass along flow path 16 in the chamber 10 towards the base of the second inlet channel 15. The second reactant gas, generally diluted in a carrier gas, is fed to fantail distributor 24 and gas restrictor 25 so as to ensure that a uniform distribution of the second gaseous reactant across the width of the glass is obtained.

The gas emanating from the base of the restrictor 25 passes through second inlet channel 15 into the stream of the first reactant gas in the coating chamber to provide a combined flow of gaseous reactants over the glass surface along flow path 17 where the two reactant gases react to deposit a coating on the hot glass surface. In one mode of operation, as more fully described in our co-pending application Ser. No. 07/420,368 of even date, the disclosure of which is incorporated herein by reference, the glass flow conditions may be controlled to provide a turbulent flow of the second reactant gas through the second inlet channel 15 and of the combined gaseous reactants along flow path 17, while avoiding upstream flow of the second reactant gas in the flow of first reactant gas along flow path 16. The spent gases (carrier gases, unreacted reactant gases and waste gases) from the reaction are withdrawn from the coating zone through exhaust duct 18 by means of reduced pressure (e.g. suction from an exhaust fan—not shown) applied through exhaust fantail 26, comprising upwardly divergent, inverted fan shaped front and back walls 27, 28. The reduced pressure not only draws gas away from the coating zone, but also induces a flow of external atmosphere under the upstream and downstream extremities 29, 30 of the coating apparatus.

The apparatus described above can be operated for prolonged periods of time without undesired blockage of the second inlet channel occurring as a result of deposition of coating material in the inlet channel, thus facilitating the production of uniform coatings on the glass ribbon at high yield.

The apparatus of the present invention is especially useful for the production of infra-red reflecting tin oxide coatings using, for example, stannic chloride as the first reactant gas and water vapour as the second reactant gas. To enhance the infra red reflectivity of the coating, a dopant, such as a source of antimony or fluorine, may be included in the reaction gases. Other coatings such as titanium oxide or titanium nitride may also be applied by means of the apparatus of the invention. To apply a titanium oxide coating, titanium tetrachloride may be used as the first reactant gas while water vapour is used as the second reactant gas. To obtain a coating of titanium nitride, titanim tetrachloride may be used as the first reactant gas while ammonia is used as the second reactant gas.

What we claim is:

1. Apparatus for depositing onto the surface of a moving ribbon of hot glass a coating formed from the reaction of at least two gaseous reactants, which apparatus includes an open-faced coating chamber in which the gaseous reactants are caused to flow in contact with the glass surface to be coated in a direction substantially parallel to the direction of movement of the glass so as to form the desired coating on the glass surface, the coating chamber opening downwardly onto, and extending across the width of, the glass surface to be coated, the coating chamber having a first inlet means for providing a flow of a first gaseous reactant over the glass surface through the chamber over the width thereof, and a second inlet means constituted by an inlet channel which extends across the ceiling of the chamber over the width of the chamber for introducing a second gaseous reactant to the flow of the first gaseous reactant in the coating chamber;

the ceiling of the coating chamber having a stepped configuration at the juncture of the said inlet channel and the coating chamber, so that the ceiling of the coating chamber on the upstream side (with reference to flow of the first reactant gas) of the inlet channel is at a higher level than the ceiling of the coating chamber on the downstream side (with reference to flow of the first reactant gas) of the said inlet channel, the line described by a longitudinal cross-section taken through the ceiling having a stepped configuration;

a first gas distributor for conveying the first gaseous reactant from a gas supply duct to said first inlet means, and a second gas distributor for conveying the second gaseous reactant from a second gas supply duct to said second inlet means;

and exhaust means located downstream (with reference to flow of the reactant gases) of the first and second inlet means leading from the coating chamber for removal of spent gases from the coating chamber.

2. Apparatus according to claim 1, wherein the ceiling of the coating chamber on the upstream side of the said inlet channel is from 5 mm to 75 mm higher than the ceiling of the coating chamber on the downstream side of the said inlet channel.

3. Apparatus according to claim 1, wherein the ceiling of the coating chamber on the upstream side of the said inlet channel is from 5 mm to 15 mm higher than the ceiling of the coating chamber on the downstream side of the said inlet channel.

4. Apparatus according to claim 1, wherein the ceiling of the coating chamber on the upstream side of the said inlet channel is 10 mm higher than the ceiling of the coating chamber on the downstream side of the said inlet channel.

5. Apparatus according to claim 1, wherein the second inlet channel is disposed substantially at right angles to the flow path of the reactant gases through the coating chamber.

6. Apparatus according to claim 1, wherein the base of the downstream side wall of the inlet channel is formed as a convex curved surface at the juncture of the said side wall and the ceiling of the coating chamber.

7. Apparatus according to claim 1, wherein each of the first and second gas distributors is defined between inverted fan-shaped front and rear walls which diverge downwardly from a central inlet to terminate in a slot extending across the width of the glass surface to be coated.

8. Apparatus according to claim 7, wherein the inverted fan-shaped front and rear walls taper downwardly towards each other to terminate in said slot.

9. Apparatus according to claim 1, further comprising a gas flow restrictor interposed between the first gas distributor and the first inlet means to provide uniform distribution of first gaseous reactant across the width of the glass surface to be coated.

10. Apparatus according to claim 1, further comprising a gas flow restrictor interposed between the second gas distributor and the second inlet means to provide uniform distribution of the second gaseous reactant across the width of the glass surface to be coated.

11. A method of depositing a coating formed from the reaction of at least two gaseous reactants onto the surface of a moving ribbon of hot glass which comprises providing a flow of a first gaseous reactant in a direction substantially parallel to the direction of movement of the glass in a coating chamber over the glass and introducing a second gaseous reactant to the flow of the first gaseous reactant through an inlet means constituted by an inlet channel which extends across the ceiling of the chamber and causing said first and second gaseous reactants to flow through said coating chamber in contact with the glass surface in a direction substantially parallel to the direction of movement of the glass to form the desired coating on the glass, the ceiling of the coating chamber having a stepped configuration at the juncture of the said inlet channel and the coating chamber, so that the ceiling of the coating chamber on the upstream side (with reference to flow of the first reactant gas) of the inlet channel is at a higher level than the ceiling of the coating chamber on the downstream side (with reference to flow of the first reactant gas) of the said inlet channel, the line described by a longitudinal cross-section taken through the ceiling having a stepped configuration.

12. A method according to claim 11 wherein the flow of the second gaseous reactant is introduced into the flow of the first gaseous reactant in a direction substantially at right angles to the flow path of the reactant gases through the coating chamber.

* * * * *